(12) United States Patent
Guter et al.

(10) Patent No.: US 10,833,215 B2
(45) Date of Patent: Nov. 10, 2020

(54) MULTI SOLAR CELL

(71) Applicant: AZUR SPACE Solar Power GmbH, Heilbronn (DE)

(72) Inventors: Wolfgang Guter, Stuttgart (DE); Matthias Meusel, Heilbronn (DE); Frank Dimroth, Gundelfingen (DE); Lars Ebel, Eisingen (DE); Rene Kellenbenz, Heilbronn (DE)

(73) Assignee: Azur Space Solar Power GmbH, Heilbronn (DE)

( * ) Notice: Subject to any disclaimer, the term of this patent is extended or adjusted under 35 U.S.C. 154(b) by 523 days.

(21) Appl. No.: 15/263,818

(22) Filed: Sep. 13, 2016

(65) Prior Publication Data

US 2016/0380142 A1 Dec. 29, 2016

Related U.S. Application Data

(63) Continuation of application No. PCT/EP2015/000333, filed on Feb. 16, 2015.

(30) Foreign Application Priority Data

Mar. 13, 2014 (EP) .................................... 14000912

(51) Int. Cl.
*H01L 31/0687* (2012.01)
*H01L 21/18* (2006.01)
(Continued)

(52) U.S. Cl.
CPC ........ *H01L 31/0687* (2013.01); *H01L 21/187* (2013.01); *H01L 31/028* (2013.01);
(Continued)

(58) Field of Classification Search
CPC ........... H01L 31/0687; H01L 31/06875; H01L 31/028; H01L 31/03046; H01L 21/187
See application file for complete search history.

(56) References Cited

U.S. PATENT DOCUMENTS 4,159,354 A * 6/1979 Milnes .................... B32B 43/00
117/81
2012/0138130 A1 6/2012 Guter et al.
(Continued)

FOREIGN PATENT DOCUMENTS

EP 0 353 423 A2 2/1990
EP 2 251 912 A1 11/2010
EP 2 650 930 A1 10/2013

OTHER PUBLICATIONS

Ge-Germanium basic parameters at 300K; http://www.ioffe.ru/SVA/NSM/Semicond/Ge/basic.html; accessed and printed Nov. 26, 2018 (Year: 2018).*

(Continued)

*Primary Examiner* — Edward J. Schmiedel
(74) *Attorney, Agent, or Firm* — Muncy, Geissler, Olds & Lowe, P.C.

(57) ABSTRACT

A multi-junction solar cell having a first subcell made of an InGaAs compound. The first subcell has a first lattice constant and A second subcell has a second lattice constant. The first lattice constant is at least 0.008 Å greater than the second lattice constant. A metamorphic buffer is formed between the first subcell and the second subcell and has a sequence of at least three layers and a lattice constant increases from layer to layer in the sequence in the direction toward the first subcell. The lattice constants of the layers of the buffer are greater than the second lattice constant, and a layer of the metamorphic buffer has a third lattice constant that is greater than the first lattice constant. A number N of compensation layers for compensating the residual stress of the metamorphic buffer is formed between the metamorphic buffer and the first subcell.

18 Claims, 3 Drawing Sheets

(51) Int. Cl.
H01L 31/054 (2014.01)
H01L 31/028 (2006.01)
H01L 31/0304 (2006.01)

(52) U.S. Cl.
CPC .... *H01L 31/03046* (2013.01); *H01L 31/0547* (2014.12); *H01L 31/06875* (2013.01); *Y02E 10/52* (2013.01); *Y02E 10/544* (2013.01); *Y02P 70/50* (2015.11)

(56) References Cited

U.S. PATENT DOCUMENTS

2012/0240987 A1 9/2012 King et al.
2015/0034142 A1 2/2015 Guter

OTHER PUBLICATIONS

GaxIn1-xAs Thermal Properties; http://www.ioffe.ru/SVA/NSM/Semicond/GaInAs/thermal.html; accessed and printed Nov. 24, 2018 (Year: 2018).*

Bett et al., "Highest Efficiency Solar Cell for Terrestrial and Space Applications," Proc. of 24$^{th}$ Eur. Photovoltaic Solar Energy Conf. & Exh., pp. 1-6 (Sep. 21, 2009).

Friedman et al., "0.7 eV GaInAs Junction for GaInP/GaAs/GaInAs(1eV)GaInAs(0.7eV) Four-Junction Solar Cell," Conf. Rec. of 4$^{th}$ IEEE World Conf. on Photovoltaic Energy Conversion, pp. 598-602 (May 2006).

Dimroth et al., "Metamorphic $Ga_yIn_{1-y}P/Ga_{1-x}In_xAs$ Tandem Solar Cells for Space and for Terrestrial Concentrator Applications at C>1000 Suns," Prog. In Photovoltaics: Res & Apps, vol. 9, No. 3, pp. 165-178 (May 3, 2001).

Sasaki et al., "Real-Time Structural Analysis of Compositionally Graded InGaAs/GaAs(001) Layers," IEEE J. of Photovoltaics, vol. 2, No. 1, pp. 35-40 (Jan. 30, 2012).

Guter et al., "Current-matched triple-junction solar cell reaching 41.1% conversion efficiency under concentrated sunlight," Appl. Phys. Let., vol. 94, pp. 223504-1 to 223504-3 (2009).

Cornfeld et al., "Evolution of a 2.05 eV AlGaInP Top Sub-cell for 5 and 6J-IMM Applications," 38$^{th}$ IEEE Photovoltaic Specialists Conference (PVSC), pp. 2788-2791 (2012).

Guter, W. (u.a.): Investigation and development of III-V-triple-junction concentrator solar cells. In: 22$^{nd}$ European Photovoltaic Solar Energy Conference, EU PVSEC; proceedings of the international conference, Sep. 3-7, 2007, Milan, Italy. 2007, S. 122-125. ISBN 3-936338-22-1.

Jan Schöne, "Kontrolle von Spannungsrelaxation und Defektbildung in metamorphen III-V Halbleiterheterostrukturen fuer hocheffiziente Solarzellen (control of strain-relaxation and defect formation in metamorphic III-V semiconductor heterostructures for high-efficiency semiconductor solar cells)," Dissertation for Engineering faculty of Christian-Albrechts-Universitaet of Kiel, pp. 1-150 (2009).

* cited by examiner

MULTI SOLAR CELL

This nonprovisional application is a continuation of International Application No. PCT/EP2015/000333, which was filed on Feb. 16, 2015, and which claims priority to European Patent Application No. 14000912.7, which was filed in Europe on Mar. 13, 2014, and which are both herein incorporated by reference.

BACKGROUND OF THE INVENTION

Field of the Invention

The invention relates to a multi-junction solar cell.

Description of the Background Art

A multi-junction solar cell is known from the publication "Current-matched triple-junction solar cell reaching 41.1% conversion efficiency under concentrated sunlight" by Guter et al., Applied Physics Letters 94, 223504 (2009). The disclosed structure is a metamorphic $Ga_{0.35}In_{0.65}P/Ga_{0.83}In_{0.17}As/Ge$ triple-junction solar cell with a high efficiency. A metamorphic buffer of $Ga_yIn_{1-y}As$ is used here between the Ge substrate or the Ge subcell and the $Ga_{0.38}In_{0.17}As$ subcell. The metamorphic buffer is formed here of seven 200-nm thick GaInAs layers with a stepwise increasing indium content, whereby the lattice constant also increases simultaneously. In the last buffer layer, the so-called overshoot layer, a higher indium content of 20% or a larger lattice constant than in the overlying $Ga_{0.83}In_{0.17}As$ subcell is used here. This is necessary to build up the stress, which leads to the relaxation of the underlying layers of the metamorphic buffer to the desired lattice constant.

Furthermore, formation of metamorphic buffers in inverted multi-junction solar cells (inverted metamorphic, IMM) with up to six subcells is known from the publication "Evolution of a 2.05 eV AlGaInP top sub-cell for 5 and 6J-IMM applications" by Cornfield et al., pp. 2788-2791, in: Photovoltaic Specialists Conference (PVSC), 2012 38$^{th}$ IEEE, ISBN 978-1-4673-0064-3. Further, a tunnel diode structure with differently stressed layers and a plurality of solar cells and a metamorphic buffer is known from EP 2251912 A1.

EP2650930 A1 discloses a quadruple-junction solar cell having a top GaInP/GaAs double-junction solar cell bonded to a bottom metamorphic GaInAs/Ge double-junction solar cell.

The term metamorphic multi-junction solar cell can be understood to mean multi-junction solar cells that have at least one metamorphic buffer layer between two subcells of the solar cell stack. It should be noted, furthermore, that in the case of epitaxy of III-V multi-junction solar cells so-called metamorphic buffers are used to be able to deposit on these buffers high-quality semiconductor layers of materials with a larger lattice constant than that of the substrate. A so-called virtual substrate with a larger lattice constant than that of the original substrate is therefore formed by the metamorphic buffer over the course of epitaxy. Semiconductor layers with the same lattice constant as that of the virtual substrate can be deposited subsequently with a high quality. A greater latitude in the selection of materials for the different subcells in multi-junction solar cells is made possible with the use of metamorphic buffers. Material combinations, in particular, can be realized hereby, which promise a higher multi-junction solar cell efficiency.

A problem with the use of metamorphic buffers is the inherent residual stress. Depending on the flexibility of the substrate employed, the residual stress leads to an undesirable curvature of the wafer. In particular, e.g., significant curvature effects arise during the production on conventional Ge substrates with a thickness smaller than 190 μm.

Curvature of the wafer leads, inter alia, to nonhomogeneous layer properties even during epitaxy due to temperature effects. Furthermore, the processing of such wafers is made difficult and reduces the yield and thereby increases production costs. Further, curvature in space solar cells with typical surfaces greater than 20 cm$^2$ leads to undesirable product properties.

SUMMARY OF THE INVENTION

It is therefore an object of the invention to provide a device that refines the prior art.

According to an exemplary embodiment of the invention, a multi-junction solar cell is provided that has a first subcell made of an InGaAs compound, whereby the first subcell has a first lattice constant, and a second subcell with a second lattice constant is provided, whereby the first lattice constant is at least 0.008 Å greater than the second lattice constant, and furthermore a metamorphic buffer is provided, whereby the buffer is formed between the first subcell and the second subcell, and the metamorphic buffer has a sequence of at least three layers and the lattice constant increases from layer to layer in the sequence in the direction toward the first subcell, and whereby the lattice constants of the layers of the buffer are greater than the second lattice constant, and whereby a layer of the metamorphic buffer has a third lattice constant and the third lattice constant is greater than the first lattice constant, and a number N of compensation layers for compensating the residual stress of the metamorphic buffer is formed between the metamorphic buffer and the first subcell, and the a lattice constant of each of the compensation layers is smaller by a value of $\Delta A_N > 0.0008$ Å than the first lattice constant, and the compensation layers have an indium content greater than 1%, and the thicknesses of the number N of compensation layers are selected such that the following applies:

$$\sum_{n=1}^{N} (KOMD_n \times \Delta A_n) > 10^{-19} m^2$$

Tensile stress can lead to a convex curvature and accordingly compressive stress to a concave curvature of the semiconductor substrate or wafer and the multi-junction solar cell preferably is formed of a III-V semiconductor material. In this case, the term 'tensile stress' can be understood to be tension caused by pulling and the term 'compressive stress' can be tension caused by pressure. It should be noted, further, that the number N comprises the set of natural numbers without zero or, stated differently, that at least one compensation layer is formed.

An advantage of the formation of a compensation layer or a plurality of compensation layers is that a wafer curvature, particularly caused by the metamorphic buffer, can be considerably reduced by this means. A yield in multi-junction solar cell production can be increased and production costs can be reduced by the introduction of the compensation layer. It is advantageous, further, to form the compensation layer after the last layer of the metamorphic buffer and preferably before the depositing of the next subcell. Stated differently, it is advantageous to form the compensation layer after the so-called "overshoot" layer of the buffer. In this case, for example, an advantageous implementation, from the standpoint of low material consumption, is to join the compensation layer by bonding to the last layer of the metamorphic buffer. It should be noted, further, that according to the aforementioned formula the magnitude of the compensation as the magnitude of the stress reduction depends directly on the difference in the lattice constant of the compensation layer in comparison with the first lattice constant multiplied by the compensation layer thickness. A certain degree of compensation stress is necessary to achieve a significant reduction in wafer curvature. It is desirable to achieve an at least 20% reduction in stress.

The lattice constant of a subcell can be equated with the lattice constant of a thickest subcell layer. The thickest subcell layer is typically one of the absorber layers of the subcell. In industrial multi-junction solar cells, which usually have an n-on-p polarity, the thickest layer is typically the positively doped base layer of the PN junction of the particular subcell.

Furthermore, the insertion of stress compensation layers has the advantage that the lattice constant of the so-called virtual substrate formed by the metamorphic buffer, after deposition of the stress compensation layers, is largely "frozen." Without the stress compensation layers, unintentional deviations or production fluctuations in the composition of the layers deposited thereafter, in particular of the relatively thick absorber layers of the subcells, can lead to further compressive stress and as a result to further relaxation of the metamorphic buffer layers. This would mean an unwanted increase in the lattice constant of the virtual substrate. The residual stress of the metamorphic buffer can be greatly reduced by inserting the stress compensation layers, however, so that the probability of an unintentional further relaxation of the metamorphic buffer is considerably reduced. Therefore, the insertion of stress compensation layers also enables a larger process window or a greater tolerance of the deposition process to production fluctuations in the composition of the layers deposited on the metamorphic buffer.

In an embodiment, the thicknesses of the number N of compensation layers can be greater overall, i.e., in total, than 150 nm. Appreciable compensation of the stress of the metamorphic buffer can be carried out with a total thickness above 150 nm. It is advantageous, if the lattice constants of the particular number N of compensation layers are smaller by at least a value of $\Delta A_N > 0.002$ Å than the first lattice constant. With $\Delta A_N < 0.002$ Å such a high total thickness of the compensation layers for realizing as high a compensation as possible is necessary that the economic efficiency of solar cell production is negatively affected to a significant extent.

In an embodiment, the value $\Delta A_N < 0.002$ Å, whereby the stress compensation layers can be formed simultaneously as layers of a semiconductor mirror or Bragg reflector. Stated differently, in this case the stress compensation layers have a dual function.

In an embodiment, it emerged that the thicknesses of the number N of compensation layers are selected such that the following applies:

$$\sum_{n=1}^{N} (KOMD_n \times \Delta A_n) > 2 * 10^{-19} m^2$$

In particular, with an increase in the difference of the lattice constants an at least 20% compensation of the tensile stress, primarily produced by the buffer, can be achieved thereby with layer thicknesses less than 1 μm.

In an embodiment, the thicknesses of the number N of the compensation layers can be selected such the following applies:

$$\sum_{n=1}^{N} (KOMD_n \times \Delta A_n) < 5 * 10^{-19} m^2$$

The probability of crack formation in the compensation layers increases considerably above the value.

A further design feature arises from the fact that the compensation layers each have a tensile stress and the in-plane (lateral) lattice constant of the compensation layer is greater than the out-of-plane (vertical) lattice constant. The in-plane lattice constant in the present case is taken to mean the lattice constant in the direction of the main extension surface of the compensation layer. Stated differently, the individual compensation layer has an anisotropic lattice constant. In an alternative embodiment, the compensation layers each have a GaAs and/or GaInAs and/or AlGaInAs and/or GaInP and/or AlGaInP and/or GaAsP and/or GaInAsP compound.

In an embodiment, the indium content of the compensation layers is 0.2% lower or 0.5% lower than the indium content of the first subcell. It is clear that the amount of the indium content exerts an essential effect on the lattice constants. It is advantageous, further, to dope part of the compensation layers or all compensation layers with Zn. It is especially advantageous if the zinc doping is greater than $10^{14}$ cm$^{-3}$.

In an embodiment, part of the compensation layers or all compensation layers are made as part of the semiconductor mirror. It is advantageous that with the dual functionality of the layers, the total thickness of the multi-junction solar cell can be reduced. In a preferred embodiment, the second subcell comprises germanium. Further, a third subcell is provided, whereby the third subcell comprises a GaInP compound. Further, it is advantageous to form a fourth subcell between the third subcell and the first subcell, whereby the fourth subcell comprises a GaAs or InGaAs or a AlGaInAs compound.

The subcells can be formed both in an upright arrangement and in an inverted arrangement. In this regard, an upright arrangement is understood to mean that the during the epitaxial production process the subcell deposited last is the topmost subcell of the multi-junction solar cell. In the present case, the topmost subcell is understood to be the subcell that is arranged closest to the sun and has the greatest band gap of all subcells. The inverted arrangement is understood to mean that the subcell deposited first during the epitaxial production process is the topmost subcell of the multi-junction solar cell. Stated differently, in the case of the upright arrangement the first subcell with the larger lattice constant has a larger band gap than the band gap of the second subcell with the smaller lattice constant. In the case of the inverted arrangement, the first subcell with the larger lattice constant has a smaller band gap than the band gap of the second subcell with the smaller lattice constant.

In an embodiment, two subcell pairs are formed in each case in an arrangement of four subcells, whereby there is a bonded connection by a direct semiconductor bond between the two subcell pairs. In this case, it is especially advantageous that the lattice stress is compensated, because the bonding process has only a low tolerance to curvature of the wafer or semiconductor wafer to be bonded. In one embodiment, it is especially advantageous that the multi-junction solar cell is a GaInP/GaAs/GaInAs/Ge quadruple-junction solar cell, having two double-junction solar cells, which are bonded by a direct semiconductor bond and one of which is an upright metamorphic GaInAs/Ge double-junction solar cell.

In an embodiment, a second or third metamorphic buffer is formed, whereby other, i.e., second or third, compensation layers are formed with the individual buffers and each of the compensation layers is formed between a metamorphic buffer and the adjacent subcell with the larger lattice constant. It should be noted, further, that the compensation layers are not part of a PN junction of a tunnel diode.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1a shows a cross section of a first embodiment of the invention of a multi-junction solar cell;

FIG. 1b shows the progression of the lattice constant, as a function of the layer sequence of the solar cell structure shown in FIG. 1a;

FIG. 1c shows the progression of the in-plane lattice constant, as a function of the layer sequence of the solar cell structure shown in FIG. 1a;

FIG. 1d shows the progression of the out-of-plane lattice constant, as a function of the layer sequence of the solar cell structure shown in FIG. 1a;

DETAILED DESCRIPTION

Figure 1:
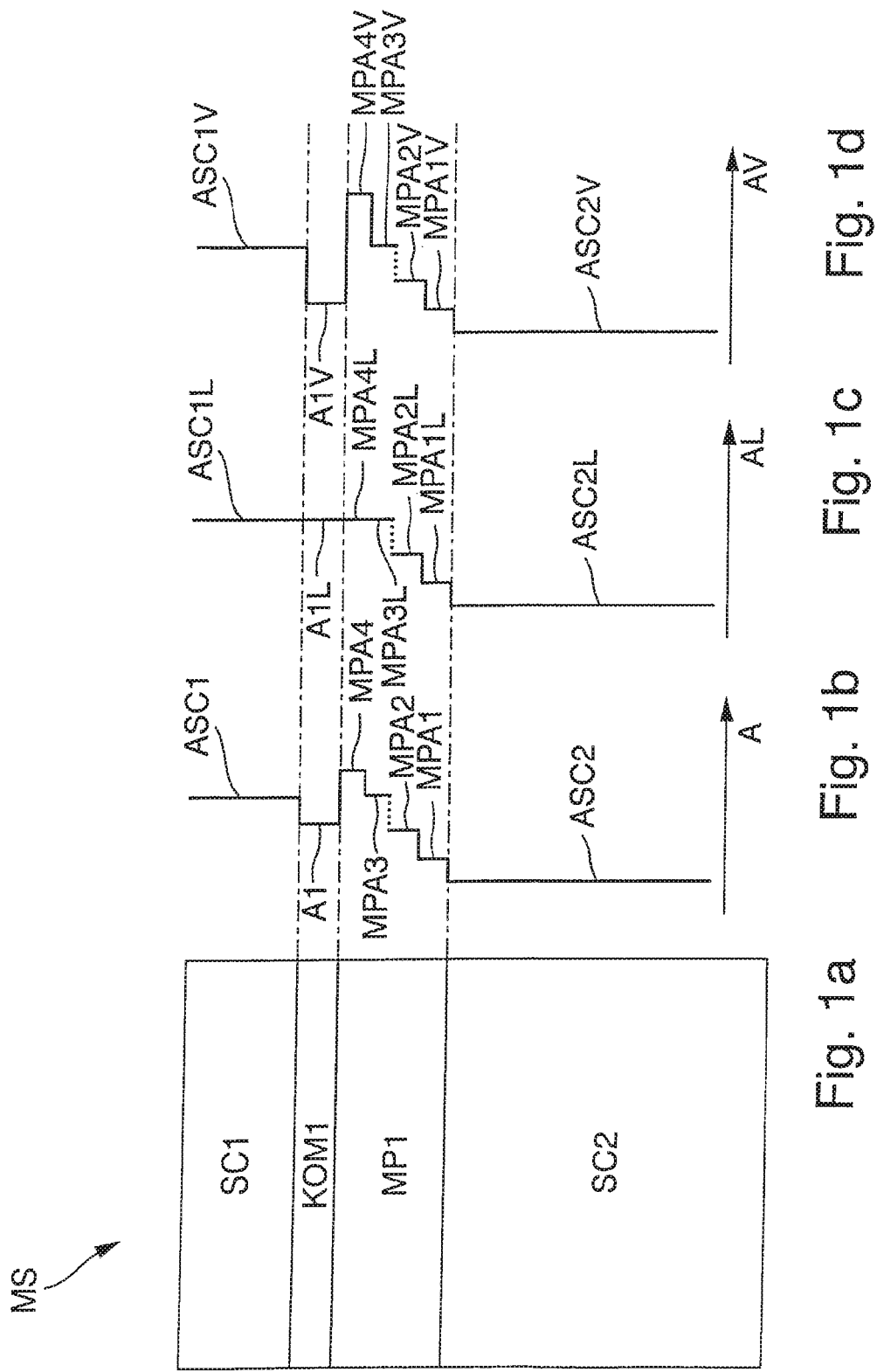

The illustration in FIG. 1a shows a cross section of a first embodiment of the invention of a multi-junction solar cell MS with a first subcell SC1. First subcell SC1 lies on a single compensation layer KOM1. It should be noted, however, that in an alternative embodiment that is not shown, instead of a single compensation layer, a plurality of N individual compensation layers are formed. Further, compensation layer KOM1 lies on a metamorphic buffer MP1, whereby buffer MP1 lies on a second subcell SC2. The buffer has a sequence of layers that are not shown.

In the illustration in FIG. 1b, the progression of lattice constant A is plotted as a function of the layer sequence of the solar cell structure, shown in FIG. 1a. Only the differences from the illustration in FIG. 1a will be explained below. It should be noted that in the present case, lattice constant A is always understood to be the so-called natural lattice constant. Second subcell SC2 has a second lattice constant ASC2. A sequence of a first layer with a lattice constant MPA1 and a second layer with a lattice constant MPA2 and a third layer with a lattice constant MPA3 and a fourth layer with a fourth lattice constant MPA4 is disposed on second subcell SC2. It is evident that lattice constants MPA1, MPA2, MPA3, and MPA4 increase from layer to layer in the sequence of layers, all lattice constants MPA1, MPA2, MPA3, and MPA4 of the sequence being greater than the second lattice constant ASC2. Furthermore, fourth lattice constant MPA4 is greater than first lattice constant ASC1. As a result, the fourth layer is also called an "overshoot" layer. Compensation layer KOM1 has a smaller lattice constant A1 than first lattice constant SCA1. It is understood that the "overshoot" layer is stressed compressively and exerts stress on the wafer.

A compensation, i.e., a reduction, of the lattice stress can be achieved only with the introduction of compensation layer KOM1 and the formation of a lattice constant A1 that is smaller compared with first lattice constant ASC1. In this respect, the extent of the reduction is the greater, the greater the thickness $KOMD_1$ of compensation layer KOM1 and the greater the difference of lattice constant A1 of compensation layer KOM1 in comparison with first lattice constant ASC1. The progression of the lattice stress is shown hereafter based on the progression of an in-plane (lateral) lattice constant AL and the progression of an out-of-plane (vertical) lattice constant AV.

The illustration in FIG. 1c shows the progression of an in-plane lattice constant AL for the layer sequence of the solar cell structure shown in FIG. 1a. Furthermore, the progression of an out-of-plane lattice constant AV for the layer sequence of the solar cell structure, illustrated in FIG. 1a, is shown in the illustration in FIG. 1d. Only the differences from the explanations of the previous figures will be indicated below. It is evident that the progression of the lattice stress for the solar cell structure can be read more accurately from the progression of in-plane lattice constant AL and from the progression of out-of-plane lattice constant AV. Second subcell SC2 has a second in-plane lattice constant ASC2L. The sequence of a first layer with an in-plane lattice constant MPA1L and a second layer with an in-plane lattice constant MPA2L and a third layer with an in-plane lattice constant MPA3L and a fourth layer with a fourth in-plane lattice constant MPA4L is formed on second subcell SC2, whereby the in-plane lattice constant MPA3L of the third layer is equal to the fourth in-plane lattice constant MPA4L. It is evident that the in-plane lattice constants MPA1L, MPA2L, and MPA3L increase from layer to layer in the sequence of the layers, whereby all in-plane lattice constants MPA1L, MPA2L, and MPA3L or MPA4L of the sequence are larger than second in-plane lattice constant ASC2L. Compensation layer KOM1 subsequently has a fourth in-plane lattice constant A1L and the first subcell SC1 a first in-plane lattice constant SC1L, whereby fourth in-plane lattice constant A1L and first in-plane lattice constant SC1L and in-plane lattice constant MPA3L and in-plane lattice constant MPA4L of the third layer and the fourth layer coincide.

Second subcell SC2 has a second out-of-plane lattice constant ASC2V. A sequence of a first layer with an out-of-plane lattice constant MPA1V and a second layer with an out-of-plane lattice constant MPA2V and a third layer with an out-of-plane lattice constant MPA3V and a fourth layer with a fourth out-of-plane lattice constant MPA4V is disposed on second subcell SC2. It is evident that the out-ofplane lattice constants MPA1V, MPA2V, MPA3V, and MPA4V increase from layer to layer in the sequence of the layers, whereby all lattice constants MPA1V, MPA2V, MPA3V, and MPA4V of the sequence are larger than second out-of-plane lattice constant ASC2V. Furthermore, first subcell SC1 has a first out-of-plane lattice constant SC1AV, whereby first out-of-plane lattice constant SC1AV is larger than second out-of-plane lattice constant ASC2V. Further, fourth out-of-plane lattice constant MPA4V is larger than the first out-of-plane lattice constant ASC1V. Compensation layer KOM1, however, has a smaller out-of-plane lattice constant A1V than the first out-of-plane lattice constant SCA1V. In a comparison of the progression of out-of-plane lattice constant AV with the progression of in-plane constant A, this means that the differences in the out-of-plane lattice constants, if present, are essentially greater than in the progression of natural lattice constant A. It should be noted that the residual stress of the metamorphic buffer according to the invention is compensated at least partially by one or more stress compensation layers. For this purpose, the stress compensation layer has a lattice constant that is smaller than the lattice constant of first subcell SC1. Furthermore, the stress compensation layer has a tensile stress or tensile tension.

Figure 2:
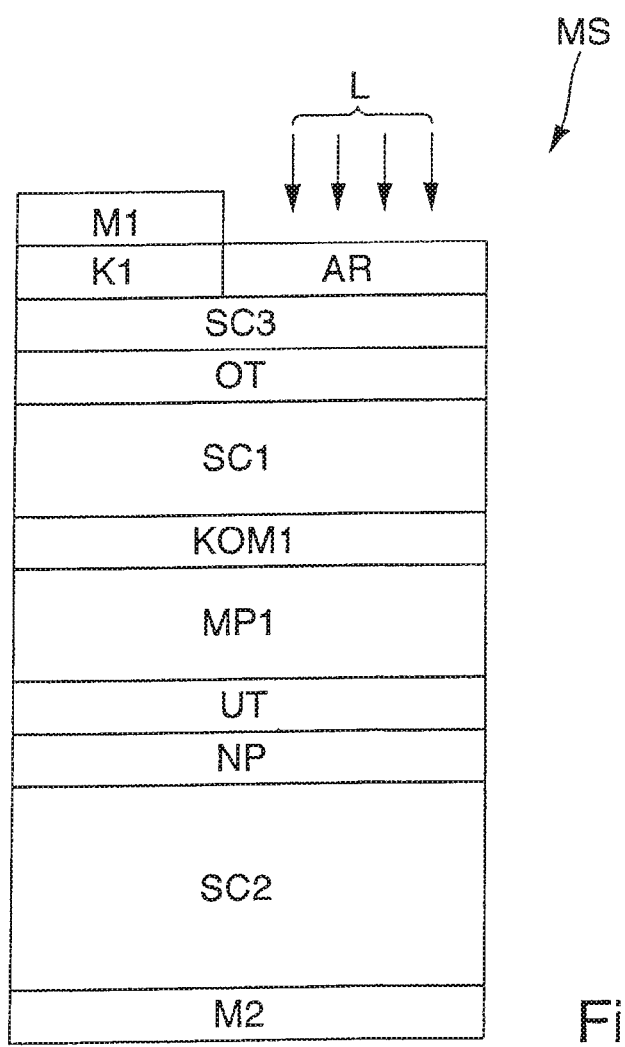
FIG. 2 shows a cross section of an embodiment of the invention as a triple-junction cell.

The illustration in FIG. 2 shows a cross section of a second embodiment of the invention in the form of a triple-junction solar cell, whereby the incidence of light L occurs through an anti-reflective layer AR. Only the differences from the illustration in the previous figures will be explained below. Second subcell SC2 is preferably integrally bonded on the bottom side to a metal layer M2. Various nucleation layers and/or single buffer layers are formed between second subcell SC2 and a bottom tunnel diode UT. The upper tunnel diode OT is formed between a third subcell SC3 and between first subcell SC1. Lying on third subcell SC3 is an anti-reflective layer AR and a contact-promoting layer K1 and a first metal layer M1. Because the bottom tunnel diode UT lies under metamorphic buffer MP1, this means in this regard that a solar cell stack having an n-on-p polarity is formed and that metamorphic buffer MP1 and stress compensation layer KOM1 are positively doped. It is preferred to make the triple-junction solar cell as an upright metamorphic GaInP/GaInAs/Ge triple-junction solar cell. In an embodiment that is not shown, the triple-junction solar cell comprises a semiconductor mirror. Preferably, the semiconductor mirror is formed between first subcell SC1 and second subcell SC2.

Figure 3:
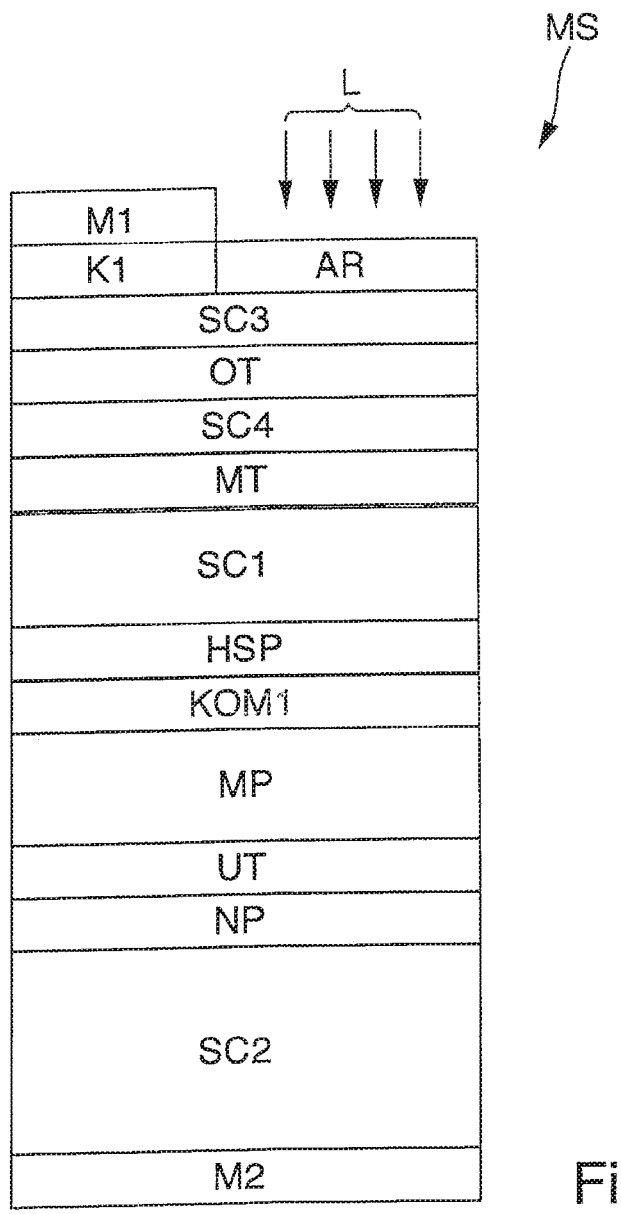
FIG. 3 shows a cross section of an embodiment of the invention as a quadruple-junction solar cell.

The illustration in FIG. 3 shows a cross section of a third embodiment of the invention in the form of a quadruple-junction solar cell. Only the differences from the illustrations in the previous figures will be explained below. Preferably, the quadruple-junction solar cell comprises a compound sequence of AlGaInP/AlGaInAs/GaInAs/Ge, whereby the AlGaInP compound is arranged as the topmost subcell facing the incident light L. A semiconductor mirror HSP is formed between first subcell SC1 and compensation layer KOM1. Further, a middle tunnel diode MT is formed between first subcell SC1 and fourth subcell SC4. Furthermore, a fourth subcell SC4 is formed between first subcell SC1 and third subcell SC3.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A multi-junction solar cell comprising:
a first subcell formed of an InGaAs compound, the first subcell having a first lattice constant;
a second subcell having a second lattice constant, the first lattice constant being greater by at least 0.008 Å than the second lattice constant;
a metamorphic buffer formed between the first subcell and the second subcell, the metamorphic buffer having a sequence of at least three layers, lattice constants of the at least three layers increasing from layer to layer in a sequence in a direction toward the first subcell and the lattice constants of the at least three layers of the metamorphic buffer being greater than the second lattice constant;
a layer of the at least three layers of the metamorphic buffer having a third lattice constant being greater than the first lattice constant; and
a plurality of N compensation layers for compensating a residual stress of the metamorphic buffer, the plurality of N compensation layers being formed between the metamorphic buffer and the first subcell, a lattice constant of each of the plurality of N compensation layers being smaller by a value of $\Delta A_N > 0.0008$ Å than the first lattice constant, the plurality of N compensation layers having an indium content greater than 1%, and a thickness of each layer of the plurality of N compensation layers being selected such that the following applies:

$$\sum_{n=1}^{N} (KOMD_n \times \Delta A_n) > 10^{-19} m^2,$$

wherein $KOMD_n$ is the thickness of said each layer of the plurality of N compensation layers.

2. The multi-junction solar cell according to claim 1, wherein a total thickness of the plurality of N compensation layers is greater than 150 nm.

3. The multi-junction solar cell according to claim 1, wherein the total lattice constant of the plurality of N compensation layers is smaller by at least a value of $\Delta A_N > 0.002$ Å than the first lattice constant.

4. The multi-junction solar cell according to claim 1, wherein the thickness of said each layer of the plurality of N compensation layers is selected such that the following applies:

$$\sum_{n=1}^{N} (KOMD_n \times \Delta A_n) > 2*10^{-19} m^2.$$

5. The multi-junction solar cell according to claim 1, wherein the thickness of said each layer of the plurality of N compensation layers is selected such that the following applies:

$$\sum_{n=1}^{N} (KOMD_n \times \Delta A_n) < 5*10^{-19} m^2.$$

6. The multi-junction solar cell according to claim 1, wherein said each layer of the plurality of N compensation layers has a tensile stress.

7. The multi-junction solar cell according to claim 1, wherein said each layer of the plurality of N compensation layers has a GaAs, GaInAs, AlGaInAs, GaInP, AlGaInP, GaAsP, or GaInAsP compound.

8. The multi-junction solar cell according to claim 1, wherein the indium content of the plurality of N compensation layers is at least 0.2% lower than the indium content of the first subcell.

9. The multi-junction solar cell according to claim 1, wherein at least one layer of the plurality of N compensation layers or all of the plurality of N compensation layers are doped with Zn.

10. The multi-junction solar cell according to claim 1, wherein at least one layer of the plurality of N compensation layers is made as part of a semiconductor mirror.

11. The multi-junction solar cell according to claim 1, wherein the second subcell contains germanium and a third subcell is provided, and wherein the third subcell comprises a GaInP compound.

12. The multi-junction solar cell according to claim 11, wherein a fourth subcell is formed between the third subcell and the first subcell, and wherein the fourth subcell comprises a GaAs or InGaAs or a AlGaInAs compound.

13. The multi-junction solar cell according to claim 1, wherein the first subcell and the second subcell are formed in an upright arrangement or in an inverted arrangement.

14. The multi-junction solar cell according to claim 12, wherein, in a solar cell stack with four subcells, two subcell pairs are formed, and
wherein the two subcell pairs are bonded together by a direct semiconductor bond.

15. The multi-junction solar cell according to claim 1, wherein a second metamorphic buffer is formed and a second number of compensation layers is formed with the second metamorphic buffer.

16. The multi-junction solar cell according to claim 1, wherein the plurality of N compensation layers are not part of a PN junction of a tunnel diode.

17. The multi-junction solar cell according to claim 1, wherein the indium content of the plurality of N compensation layers is at least 0.5% lower than the indium content of the first subcell.

18. The multi-junction solar cell according to claim 1, wherein the plurality of N compensation layers are formed directly on and contacting the metamorphic buffer.

* * * * *